United States Patent
Hurtz et al.

(10) Patent No.: US 8,080,988 B2
(45) Date of Patent: Dec. 20, 2011

(54) SWITCH DRIVER WITH LOW IMPEDANCE INITIAL DRIVE AND HIGHER IMPEDANCE FINAL DRIVE

(75) Inventors: Gary Michael Hurtz, Shanghai (CN); Trinh Khac Hue, Hung Yen Province (VN); David J. Kunst, Cupertino, CA (US)

(73) Assignee: Active-Semi, Inc. (VG)

( * ) Notice: Subject to any disclaimer, the term of this patent is extended or adjusted under 35 U.S.C. 154(b) by 623 days.

(21) Appl. No.: 12/214,478

(22) Filed: Jun. 18, 2008

(65) Prior Publication Data

US 2009/0315612 A1    Dec. 24, 2009

(51) Int. Cl.
*G05F 1/613*    (2006.01)
*G05F 1/46*    (2006.01)

(52) U.S. Cl. .................... 323/289; 323/222; 323/284

(58) Field of Classification Search ........... 323/289, 323/222, 282, 283, 284; 327/112, 377, 427, 327/581; 330/207 A, 251
See application file for complete search history.

(56) References Cited

U.S. PATENT DOCUMENTS

| | | | | |
|---|---|---|---|---|
| 3,619,658 A | * | 11/1971 | Prunty | 327/484 |
| 6,429,701 B2 | * | 8/2002 | Karaki et al. | 327/110 |
| 7,199,646 B1 | * | 4/2007 | Zupcau et al. | 327/539 |
| 7,688,049 B2 | * | 3/2010 | Iwabuchi et al. | 323/271 |

* cited by examiner

*Primary Examiner* — Gary L Laxton
(74) *Attorney, Agent, or Firm* — Imperium Patent Works; T. Lester Wallace; Darien K. Wallace

(57) ABSTRACT

A driver circuit (for example, in a switching power supply or in a Class-D switching amplifier) drives a gate of a switch during a transition with a low output impedance during an initial period and then for the remainder of the transition drives the gate with a midrange output impedance. The switch in turn switches current flow through an inductor. The driver circuit includes a "Drive Node Voltage Dependent Impedance Circuit" (DNVDIC) that couples the gate to a supply voltage node. In one embodiment, there are two resistive current paths through the DNVDIC. A non-linear device in the first current path switches from having a small to a large impedance when a voltage drop across the device falls below a threshold voltage. The resulting increase in impedance of the first current path decreases voltage edge rates and reduces noise, whereas the low initial impedance reduces transition power losses.

26 Claims, 11 Drawing Sheets

TRANSITION POWER LOSS

TRI-STATE CMOS INVERTER
27

ONE-SHOT CONTROLLED
VARIABLE IMPEDANCE PULLDOWN DRIVE

ACTIVE VOLTAGE DETECT CONTROLLED
VARIABLE IMPEDANCE PULLDOWN DRIVE

CLASS-D SWITCHING AMPLIFIER

SWITCH DRIVER WITH LOW IMPEDANCE INITIAL DRIVE AND HIGHER IMPEDANCE FINAL DRIVE

TECHNICAL FIELD

The present invention relates to driving a signal onto a drive node (for example, a gate of a switch transistor in a switching power supply or in a Class-D switching amplifier) with a driver such that the signal transitions, where the driver has a low output impedance during an initial portion of the transition and wherein the driver has a higher output impedance during a terminal portion of the transition.

BACKGROUND

FIG. 1 (Prior Art) is a diagram of a switching power supply 1. This particular power supply is a type of power supply referred to as a "boost" converter or "boost switching power supply". During a first time period, controller integrated circuit 2 controls switch 3 to be on and conductive such that current flows through the inductor 4 and through the switch 3 and to ground as indicated by arrow 5. As this current flows, energy is stored in inductor 4. Then, in a second time period, controller integrated circuit 2 controls switch 3 to be off and nonconductive. Current in an inductor cannot stop instantaneously, so current flows through inductor 4, through a diode 6, and to a storage capacitor 7 and a load 8. This current flow during the second time period is illustrated in FIG. 2 (Prior Art) by arrow 9. The energy that was stored in inductor 4 is now transferred to capacitor 7 and to load 8. Controller integrated circuit 2 monitors VFB via terminal 10 and rapidly switches switch 3 on and off such that the output current flowing through the load (a string of white LEDs) is regulated to a desired current. The converter is called a "boost converter" because VOUT can be higher than the input supply voltage VIN.

Two performance parameters of the switching power supply are efficiency and noise emissions. Efficiency is equal to output power divided by input power. Power loss within the switching power supply therefore translates into lower power supply efficiency. There are multiple kinds of power loss. One type of power loss is referred to as "transition power loss", and is equal to the voltage across the switch (VDS) multiplied by the current flow through the switch (IDS). When switch 3 is off, there is no appreciable drain to source current flow through the switch so there is little power loss. When switch 3 is fully on and conductive, there is only a slight drain to source voltage drop across the switch. The switching terminal 11 is very close to ground potential. Accordingly, the product of IDS and VDS is also very small. There is, however, a short period of time when the switch is transitioning. During this transition time there is appreciable drain to source current flow, and there is an appreciable drain to source voltage drop across the switch. Power dissipation during this transition time is therefore also appreciable.

FIG. 3 is a diagram that illustrates the drain to source current IDS and drain to source voltage drop VDS. The dashed line 12 represents the transition power loss. This transition power loss can be reduced by driving the switch harder (with a driver having a lower output impedance) such that switch 3 switches faster. The period of time that IDS and VDS are simultaneously at appreciable levels during a switch transition is therefore reduced, and transition power loss is reduced.

Driving switch 3 harder such that it switches on and off faster, however, results in higher voltage changes (dV/dT) at node SW and undesirable ringing, both of which contribute to EMI (electromagnetic interference) and noise emissions.

FIG. 4 (Prior Art) is a simplified waveform diagram that illustrates operation of the boost converter of FIGS. 1 and 2. When switch 3 turns on, there is ringing as illustrated by reference numeral 13. When switch 3 turns off, there is ringing as illustrated by 14. There are parasitic capacitances on switch node 15. Such parasitic capacitances include a capacitance due to the drain of switch 3, diode 6, a capacitance inherent in inductor 4, and capacitance associated with the physical terminal 11 and interconnect at node 15. This parasitic capacitance of node 15 in combination with the inductance of inductor 4 forms an LC circuit that can ring. The faster switch 3 is turned off and on, the higher the voltage change at SW and the larger the ringing and the larger the resulting radiated noise is seen to be. It is desired simultaneously to increase efficiency and to reduce noise emissions.

FIG. 5 (Prior Art) is a diagram of a first circuit 20 that strives to reduce transition loss without generating excessive noise. Switch 21 is switched on and off to switch current flow through inductor 22 as described above in connection with FIGS. 1 and 2. Input signal SIN on input lead 23 is a pulse train. Inverters 24 and 25 are of increasing drive strength. A second assist path involving inverter 26 and tri-state inverter 27 are provided to increase the drive of the gate of switch 21 during an initial portion of each transition of the signal SIN. FIG. 6 (Prior Art) is a circuit diagram of tri-state inverter 27.

An edge triggered one-shot 29 detects edges of the signal SIN and in response to each such edge generates a pulse. This pulse enabled tri-state inverter 27, thereby allowing the assist path to help in driving the gate of switch 21. Both inverter 25 and tri-state inverter 27 then drive the gate of switch 21. The objective of the circuit is to have this one-shot pulse terminate before the voltage on the gate of switch 21 has completed the voltage transition. When the pulse terminates, tri-state inverter 27 goes high impedance (i.e., "tri-states") thereby decoupling the assist path from the gate of switch 21. Accordingly, only inverter 25 drives the gate of switch 21 during the remaining portion of the transition. This reduces the rate of change of the voltage on the gate of switch 21 at the end of each transition, and helps to reduce noise and ringing. The rapid rate of change of the voltage on the gate of switch 21 during the initial portion of the transition, however, serves to reduce transition power loss.

The circuit of FIG. 5, however, has many problems. The total duration of the transition of the voltage on the gate of switch 21 is small. Generating a very small pulse for controlling switch 21, where the small pulse has precise timing, may be difficult or impossible to achieve. Making the timing of the pulse track with changing characteristics of switch 21 due to temperature changes, supply voltage changes and/or process changes is difficult to achieve. The circuit is complex and large and therefore expensive to realize in a cost-sensitive switching power supply controller integrated circuit.

FIG. 7 (Prior Art) is a diagram of a second circuit 30 that strives to reduce transition loss without generating excessive noise. In the circuit of FIG. 7, a comparator 31 or other voltage detecting amplifier device compares the voltage on the gate of switch 32 to a reference voltage VREF. Consider a high-to-low voltage transition of the voltage on the gate of switch 32. Initially, the voltage on the gate is higher than VREF. Comparator 31 therefore outputs a digital logic high signal that enables tri-state inverter 33. The assist path involving inverter 34 and tri-state inverter 33 therefore drives the gate of switch 32 along with the primary path involving inverters 35 and 36. The voltage on the gate of switch 32 falls rapidly during this initial time. When the voltage on the gate of switch 32 reaches VREF, comparator 31 switches and disables tri-state inverter 33, thereby disabling the assist path. The desired result is a less rapid change in the voltage on the gate of switch 32 during a final portion of the switching transition. The reduced rate of change of the gate voltage during the final portion of the transition reduces ringing, whereas the rapid change of the voltage on the gate of switch 32 during the initial portion of the transition serves to reduce transition power loss.

The circuit of FIG. 7 has many problems. For example, getting changes in performance of the assist path turn on and turn off circuitry to track changes in operational characteristics of switch 32 may be difficult to achieve. The two types of circuits are different and therefore tend to react to changing conditions differently. Secondly, the comparator and tri-state disable path may not be adequately fast. The voltage on the gate of switch 32 may transition down and reach VREF and continue on downward a substantial amount before comparator 31 detects the crossing of VREF and disables inverter 33 to disable the assist path. Making this assist enable/disable signal path faster may increase power consumption of the comparator an unacceptable amount. Moreover, a comparator such as comparator 31 is a somewhat large circuit and therefore may be expensive to realize in a cost-sensitive switching power supply controller integrated circuit.

SUMMARY

A driver circuit in a switching power supply controller integrated circuit within a switching power supply drives a gate of a switch during a transition with a low output impedance during an initial portion of the transition and then for the remainder of the transition drives the gate of the switch with a midrange output impedance. The switch in turn switches current flow through an inductor. The driver circuit includes a drive node voltage dependent impedance circuit (DNVDIC) that couples the gate to a supply voltage node. There are two resistive current paths through the DNVDIC. A non-linear device in the first current path changes from having a very small impedance to having a very large impedance when a voltage drop across the device drops to being less than a threshold voltage. The resulting increase in impedance of the first current path at the end of the transition serves to increase the output impedance of the driver, thereby slowing the rate of change of the voltage on the gate of the switch and reducing noise in the power supply. The low initial output impedance of the driver serves to decrease the overall amount of time required to transition the voltage on the gate of the switch and therefore serves to reduce transition power losses.

In a first example, the device is a diode-connected transistor, where the transistor is of the same type of transistor as the switch. Both the diode-connected transistor and the transistor of the switch may, for example, be high voltage N-channel transistors having the same construction and same gate dielectric thickness.

In a second example, the device is a transistor whose gate is coupled to receive a digital logic level signal and whose source is coupled to the gate of the switch. During a gate voltage signal transition, when the voltage on the gate of the switch approaches the voltage on the gate of the device transistor, the gate-to-source voltage on the device transistor falls below the threshold voltage of the device transistor. The device transistor therefore turns off and changes from having a very low drain to source impedance to being off and having a very high drain to source impedance. This turning off of the device transistor stops current flow through the first current path, and causes the overall output impedance of the DNVDIC to change from the low impedance to the midrange impedance.

In some embodiments, the driver circuit includes two DNVDIC circuits. One is a pulldown DNVDIC circuit for coupling the gate of the switch to a ground node. The pulldown DNVDIC discharges the gate capacitance of the switch to ground during a high-to-low transition of the gate voltage. A second is a pullup DNVDIC circuit for coupling the gate of the switch to a supply voltage node. The pullup DNVIDC charges the gate capacitance of the switch during a low-to-high transition of the gate voltage.

The driver circuit sees application outside of switching power supplies. In one example, the driver circuit drives switches in a Class-D switching amplifier.

Other structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 1 (prior art) is a diagram of boost switching power supply when switch 3 of the power supply is on.

DETAILED DESCRIPTION

Reference will now be made in detail to some embodiments of the invention, examples of which are illustrated in the accompanying drawings.

Figure 8:
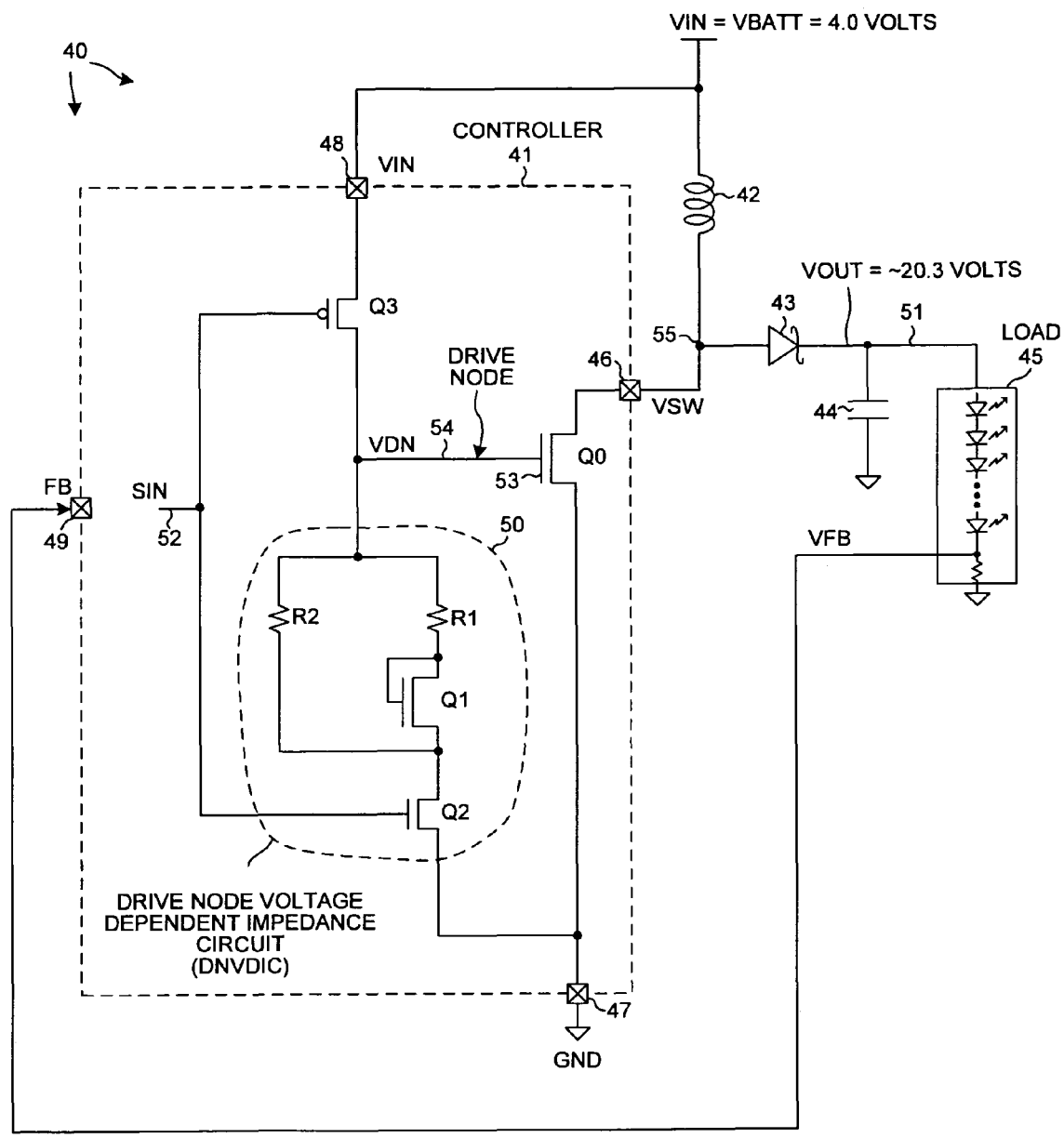
FIG. 8 is a diagram of a first embodiment of a novel switching power supply controller integrated circuit.

FIG. 8 is a diagram of a first embodiment of a switching power supply in accordance with one novel aspect. Switching power supply 40 is a boost converter. Power supply 40 includes a novel switching power supply controller integrated circuit 41, an inductor 42, a Schottky diode 43, a storage capacitor 44, and a load 45. The novel switching power supply controller integrated circuit 41 includes a switch Q0, a switch terminal 46, a ground terminal 47, a supply voltage terminal 48, a feedback terminal 49, a P-channel pullup transistor Q3, and a novel drive node voltage dependent impedance circuit (DNVDIC) 50. Controller integrated circuit 41 monitors VFB via feedback terminal 49 and switches switch Q0 such that the current flow through load 45 is regulated. In the present example, load 45 is a string of white light emitting diodes (LEDs) for backlighting a display screen of a cellular telephone. VOUT is approximately 20.3 volts, whereas VIN on supply voltage terminal 48 is 4.0 volts (for example, from a lithium battery).

Controller integrated circuit 41 supplies a digital input signal SIN onto input signal node 52. If switch Q0 is to be turned off, then the digital input signal SIN on node 52 is made to transition from a digital logic low level to a digital logic high level. If, on the other hand, switch Q0 is to be turned on, then the digital input signal SIN on node 52 is made to transition from a digital logic high level to a digital logic low level. The circuitry that receives the signal on feedback terminal 49 and from it generates the input signal SIN is not illustrated here, but any suitable one of numerous conventional circuits and techniques known in the prior art for performing this function can be used.

Operation of switching power supply 40 of FIG. 8 is explained in connection with two transitions of the voltage on the gate 53 of switch Q0: 1) a high-to-low transition, and 2) a low-to-high transition. Gate 53 is coupled to a "drive node" 54. The gate voltage is therefore also referred to here as the drive node voltage VDN. As illustrated in FIG. 8, DNVDIC 50 includes a first diode-connected transistor Q1, a second transistor Q2, a first resistor R1, and a second resistor R2.

High-to-Low VDN Transition:

Initially the input signal SIN on signal input node 52 has a digital logic low level. N-channel transistor Q2 is nonconductive and P-channel transistor Q3 is conductive. Drive node 54 is therefore coupled to supply voltage terminal 48, and the voltage on gate 53 is four volts. Because N-channel transistor Q2 is off and nonconductive, DNVDIC 50 provides a high impedance between drive node 54 and ground terminal 47. In the present example this impedance is greater than 500 k ohms.

Next, the input signal SIN on signal input node 52 is made to transition from the low digital logic level to a high digital logic level. The voltage on signal input node 52 transitions from ground potential to four volts. P-channel transistor Q3 is therefore turned off and N-channel transistor Q2 is turned on. There are two current paths from drive node 54 to ground terminal 47. The first current path extends from drive node 54, through resistor R1, through diode-connected transistor Q1, through conductive N-channel transistor Q2, and to ground terminal 47. The second current path extends from drive node 54, through resistor R2, through N-channel transistor Q2, and to ground terminal 47. The impedance of DNVDIC 50 between node 54 and ground terminal 47, assuming that the impedance through each of transistors Q1 and Q2 is much less than the resistances of R1 and R2, is approximately equal to the equivalent resistance of parallel resistors R1 and R2. The equivalent resistance is given by (R1*R2)/R1+R2. This impedance is referred to here as a "low impedance" in that it is less than the "high impedance" discussed above, and it is less than a "midrange impedance" described below. In the present example, this low impedance is less than fifty ohms. Due to this low impedance between drive node 54 and ground terminal 47, the voltage VDN on drive node 54 transitions downward rapidly from 4.0 volts to the threshold voltage of the diode-connected transistor Q1.

When the voltage VDN drops below the threshold voltage of diode-connected transistor Q1, the diode-connected transistor Q1 is no longer forward biased and stops conducting current (conducts at most a minimal current). The first current path through resistor R1 is therefore closed. The second current path through resistor R2, however, continues to conduct current. The effective impedance of DNVDIC 50 is the resistance of resistor R2 (assuming that the drain to source resistance through transistor Q2 is much less than the resistance of resistor R2). The impedance of DNVDIC 50 at this time is referred to here as a "midrange impedance". In the present example, this midrange impedance is more than 50 ohms but is less than 500 k ohms. Due to the increase in impedance between drive node 54 and ground terminal 47, the rate of discharge of the gate capacitance of switch Q0 changes from a more rapid decrease to a less rapid decrease. The gate voltage on node 54 continues to decrease to ground potential through this midrange impedance until the high-to-low transition of VDN is complete.

Low-to-High VDN Transition:

Initially the input signal SIN on signal input node 52 has a digital logic high level. N-channel transistor Q2 is conductive and P-channel transistor Q3 is nonconductive. The voltage VDN on node 54 is at ground potential. The first current path through diode-connected transistor Q1 has a very high impedance due to the voltage drop across diode-connected transistor being less than the threshold voltage of the diode-connected transistor, but the second current path through resistor R2 continues to have its R2 impedance. DNVDIC 50 therefore provides the midrange impedance between drive node 54 and ground terminal 47, and this midrange impedance holds the voltage on the gate of switch Q0 at ground potential.

Next, the input signal SIN on signal input node 52 is made to transition from the high digital logic level to the low digital logic level. N-channel transistor Q2 is made to turn off such that DNVDIC 50 is made to have the high impedance. As set forth above, the high impedance in this example is greater than 500 k ohms. The high-to-low transition of the input signal SIN on signal input node 52 causes P-channel transistor Q3 to turn on. The voltage VDN on the gate of switch Q0 rises rapidly from ground potential to the four voltage potential on supply voltage terminal 48.

The low-to-high voltage transition of VDN, unlike the high-to-low voltage transition, does not have a steep slope followed by a shallow slope. The pullup circuit in this example does not have a midrange pullup impedance during a terminal portion of the VDN transition. Accordingly, there may be undesirable EMI generated as a consequence of the low-to-high VDN transition.

In one novel aspect, transistors Q2 and Q3 are low voltage transistors that have the same particular structure and same gate dielectric thickness, whereas transistors Q1 and Q0 are high voltage transistors that both have a different particular structure and gate dielectric thickness. Both transistors Q1 and Q0 are N-channel devices, and are disposed relatively close to one another on the controller integrated circuit die. The two transistors Q1 and Q0 therefore have the same or similar temperatures, and will be affected by temperature changes in the same way. Due to transistors Q0 and Q1 being located close to one another, variances in semiconductor processing will affect both transistors in the same way. Accordingly, the threshold voltage of Q1 tracks well with changes in the threshold voltage of switch Q0. The impedance adjusting portions of the prior art circuits of FIGS. 5 and 7, on the other hand, have difficulties adjusting to threshold voltage changes in the switch transistor at least in part due to the components making up the impedance adjusting circuit being dissimilar structures from the switch.

In a second novel aspect, the component that causes the impedance to change from the low impedance to the midrange impedance is a component (a diode-connected transistor Q1) that is disposed in the first current path. This component changes its own impedance in direct response to discharging current that is flowing through the component, and this changed impedance directly affects the overall impedance of the DNVDIC. The impedance adjusting portions of the prior art circuits of FIGS. 5 and 7, on the other hand, employ circuitry outside the gate discharge current path to control and change another component that is in the discharge current path. The prior art circuit of FIG. 5, for example, uses one-shot 29 that is outside the discharge current path. The prior art circuit of FIG. 7, for example, uses comparator 31 and a voltage reference circuit that are outside the discharge current path. In comparison to the impedance adjusting portions of the prior art circuits of FIGS. 5 and 7, diode-connected transistor Q1 and resistor R1 are relatively small and simple circuits, and do not consume any quiescent current, which also improves efficiency.

Figure 1:
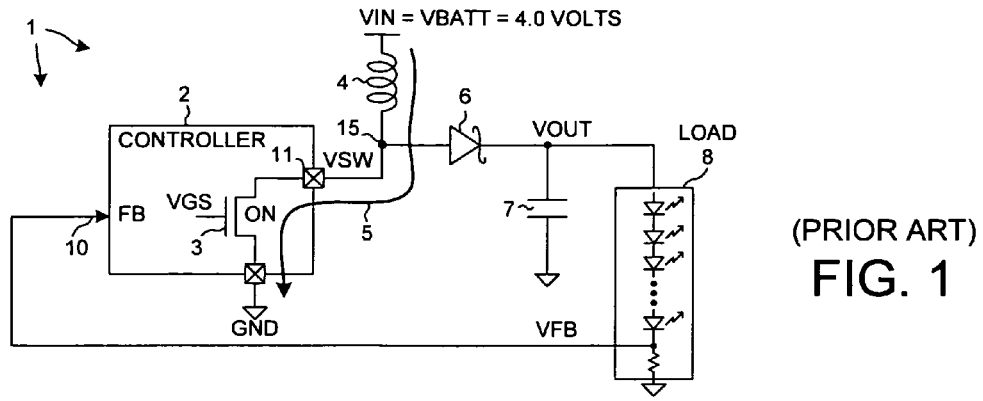
Figure 2:
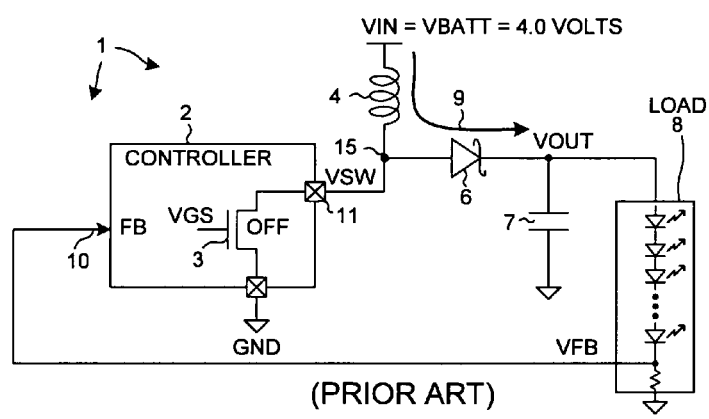
FIG. 2 (prior art) is diagram of the boost switching power supply of FIG. 1 when switch 3 is off.
Figure 3:
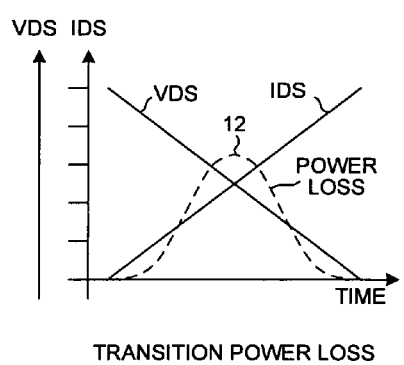
FIG. 3 (prior art) is a diagram that illustrates transition power loss.
Figure 4:
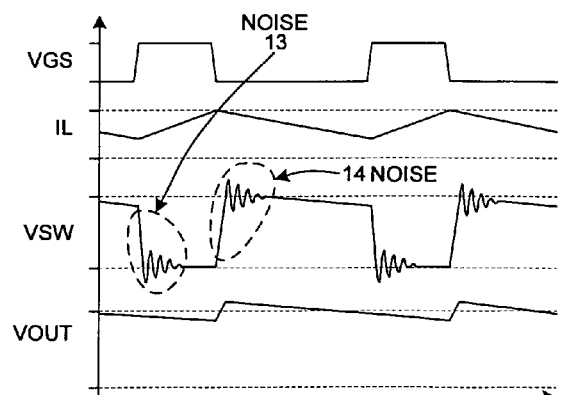
FIG. 4 (prior art) is a simplified waveform diagram that illustrates an operation of the boost switching power supply of FIGS. 1 and 2.
Figure 6:
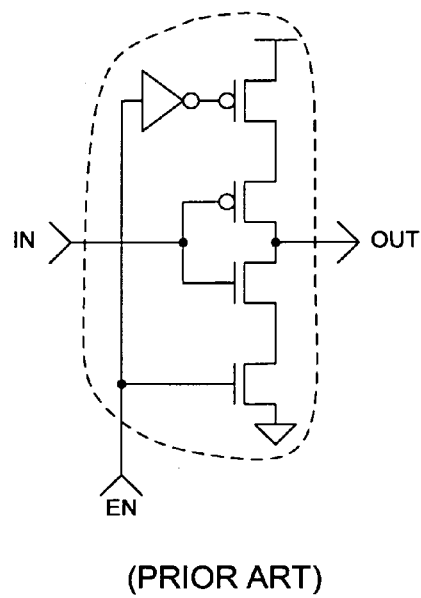
FIG. 6 (prior art) is a circuit diagram of the tri-state inverter 27 of the circuit of FIG. 5.
Figure 5:
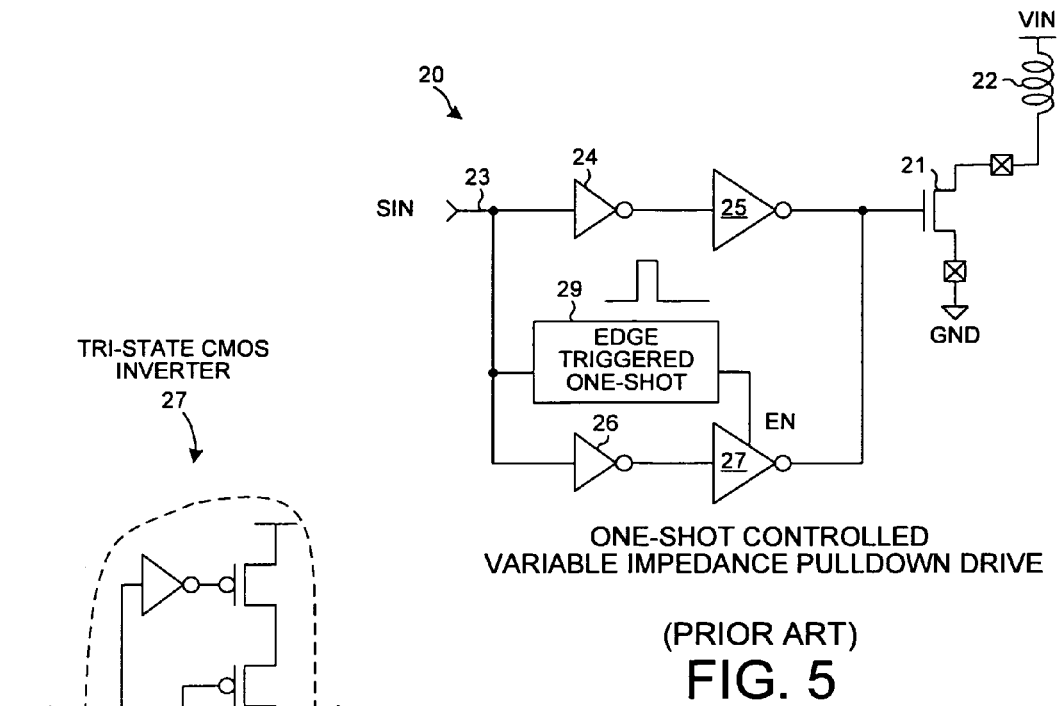
FIG. 5 (prior art) is a diagram of a one-shot controlled circuit that drives the gate of a switch of a switching power supply. During a gate voltage transition, the circuit drives the gate with an initial low output impedance followed by a higher output impedance.
Figure 7:
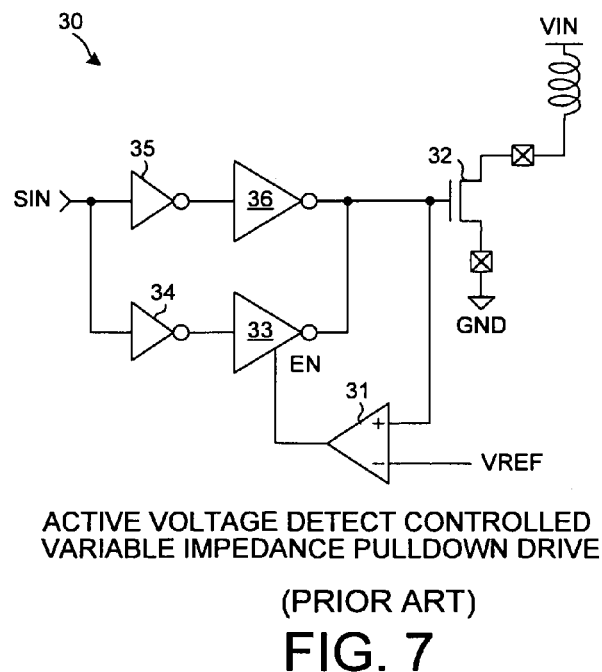
FIG. 7 (prior art) is a diagram of an active voltage detect circuit that drives the gate of a switch of a switching power supply. During a gate voltage transition, the circuit drives the gate with an initial low output impedance followed by a higher output impedance.

In a third novel aspect, diode-connected transistor Q1 can change the impedance of DNVDIC in response to the voltage VDN dropping below a predetermined voltage faster than the impedance adjusting portions of the prior art circuits of FIGS. 5 and 7. In the prior art of FIG. 5 there is a substantial signal propagation delay through the one-shot 29. In the prior art of FIG. 7 there is a substantial signal propagation delay through comparator 31. These signal propagation delays are not present in the novel circuit of FIG. 8.

Figure 9:
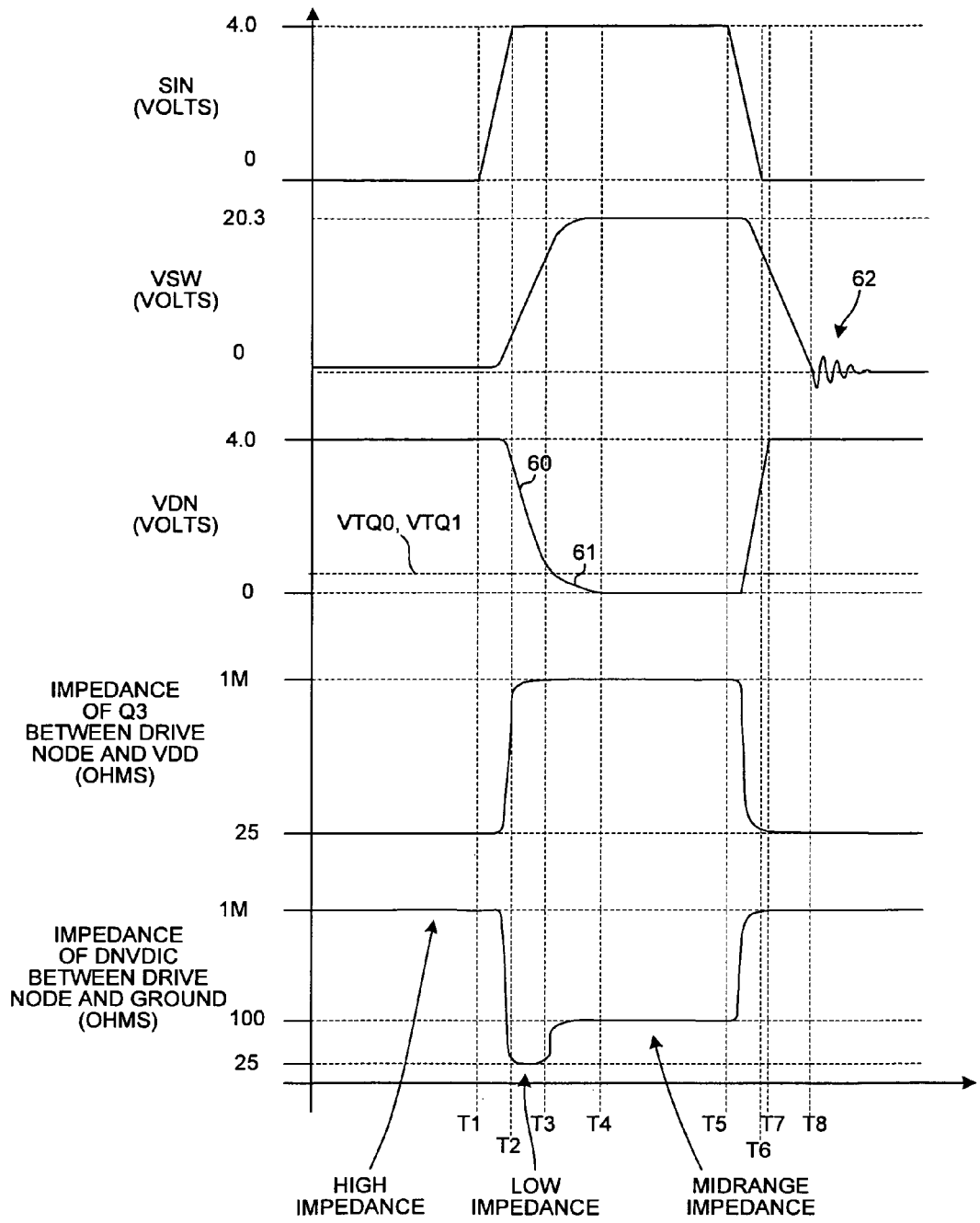
FIG. 9 is waveform diagram that illustrates an operation of the circuit of FIG. 8.

FIG. 9 is a simplified waveform diagram that illustrates an operation of the novel switching power supply controller integrated circuit 41 of FIG. 8. The "high impedance" of DNVDIC 50 in FIG. 9 is 500 k ohms, the "low impedance" of DNVDIC 50 is 25 ohms, and the "midrange impedance" is approximately 100 ohms. The low impedance pulldown operation of DNVDIC 50 causes the relatively steep decline 60 of the voltage VDN during a first portion of a high-to-low VDN transition. The midrange impedance pulldown operation of DNVDIC 50 causes the less steep decline 61 of the voltage VDN during a second subsequent portion of the high-to-low VDN transition. DNVDIC 50 pulls down on drive node 54 with an initial low impedance and then with a midrange impedance to help prevent or reduce ringing in the VSW signal on switch node 55. Note that no ringing is illustrated in the VSW waveform around time T4.

Figure 10:
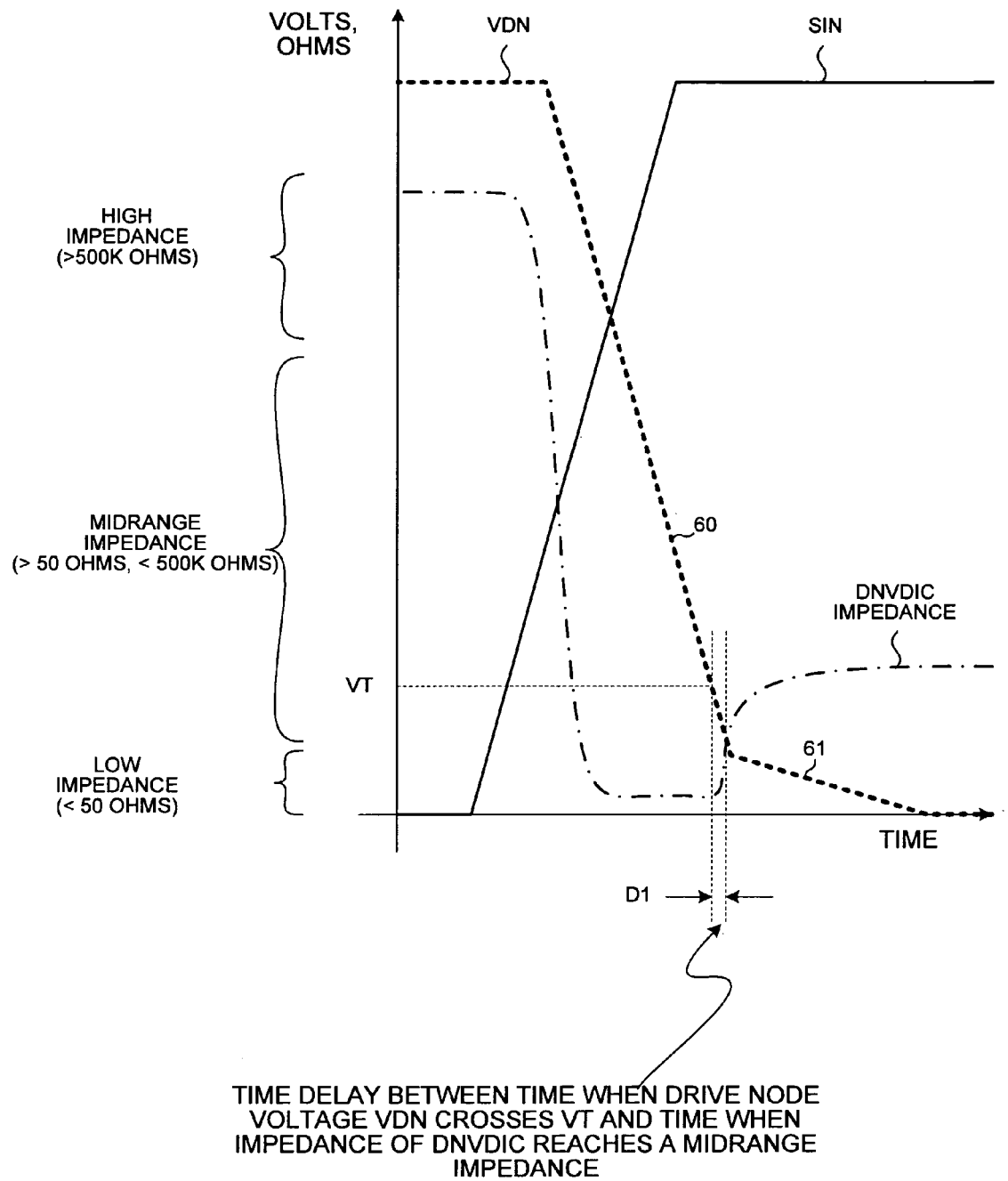
FIG. 10 is an enlarged diagram that illustrates how the output impedance of the novel driver circuit of FIG. 8 changes during a gate voltage transition. During an initial portion of the transition time, the novel driver has a low output impedance. During a subsequent terminal portion of the transition time, the novel driver has a midrange output impedance.

FIG. 10 is a waveform diagram that shows the VDN waveform and the impedance of the DNVDIC circuit 50 in more detail. The time delay D1 between the time when VDN drops below VTQ0 and the time when the slope of VDN changes is very small (in this example the time delay D1 is less than two nanoseconds).

Figure 11:
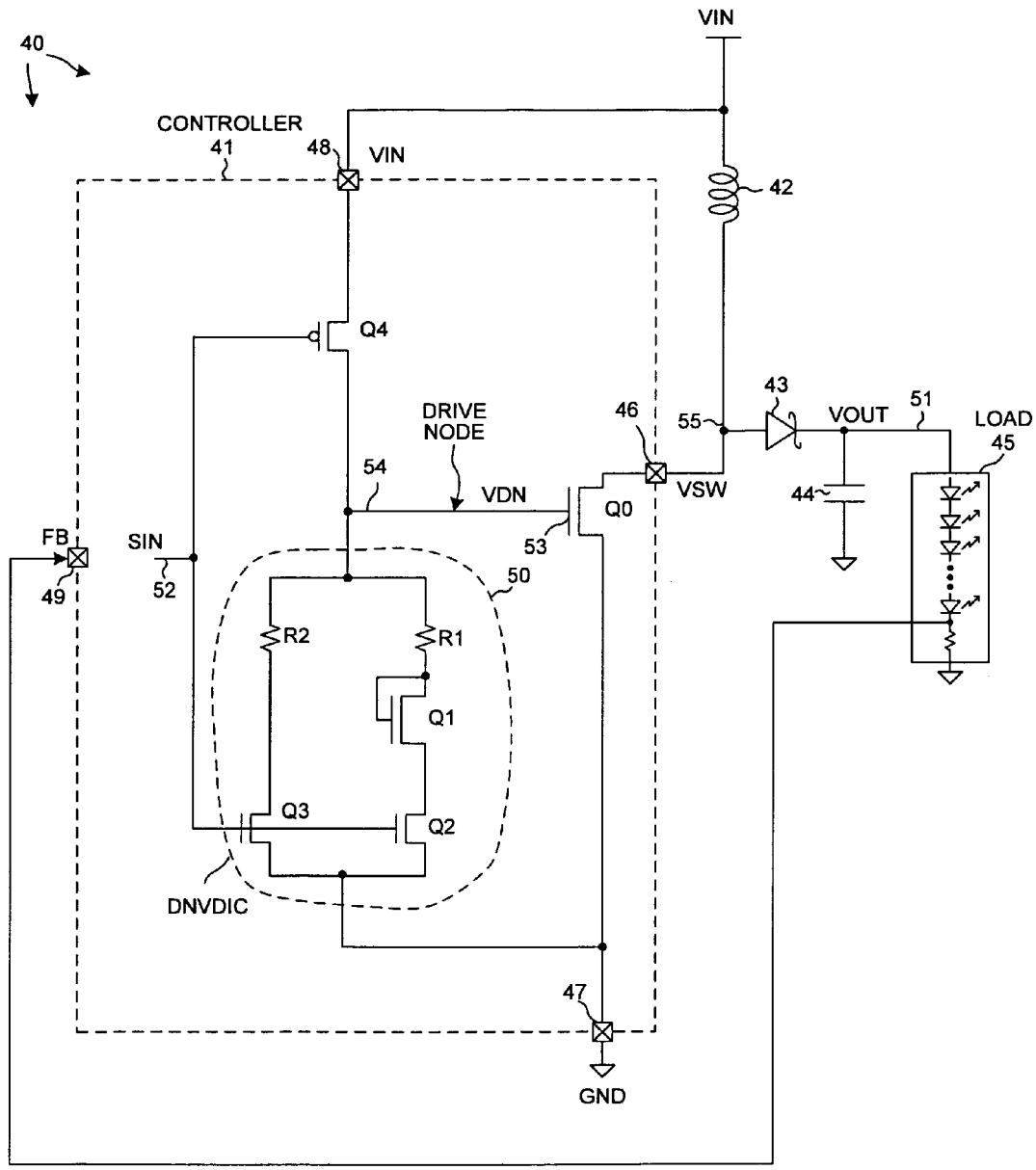
FIG. 11 is a diagram of a second embodiment of a novel switching power supply controller integrated circuit.

FIG. 11 is a diagram of a second embodiment of novel switching power supply controller integrated circuit 41. In this embodiment, DNVDIC 50 includes an additional N-channel transistor Q3. The first current path extends from drive node 54, through resistor R1, through diode-connected transistor Q1, through transistor Q2, and to the ground terminal 47. The second current path extends from drive node 54, through resistor R2, through transistor Q3, and to ground terminal 47. As in the circuit of FIG. 8, when the voltage VDN drops on a high-to-low VDN transition to below the threshold voltage of the diode-connected transistor Q1, the diode-connected transistor becomes nonconductive and changes to have a very high impedance. Current stops flowing in the first current path, and the impedance of DNVDIC 50 changes from the "low impedance" (R1*R2)/R1+R2 to the "midrange impedance" R2. The drive node voltage VDN then continues to decrease due to current flow through the second current path until VDN reaches ground potential.

Figure 12:
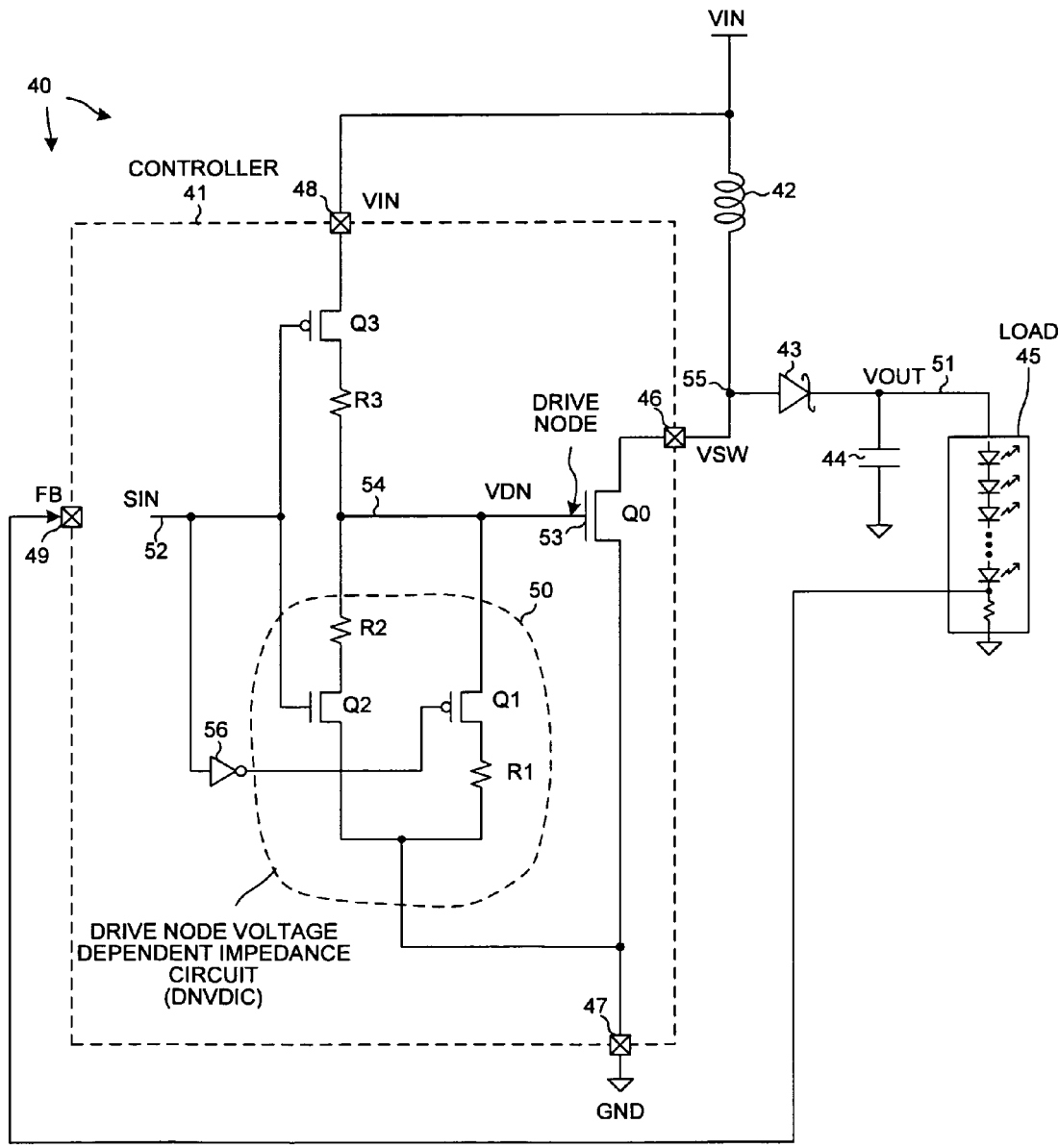
FIG. 12 is a diagram of a third embodiment of a novel switching power supply controller integrated circuit.

FIG. 12 is a diagram of a third embodiment of novel switching power supply controller integrated circuit 41. In this embodiment, transistors Q2 and Q3 and resistors R2 and R3 form a digital logic inverter. In addition, there is a second inverter 56 connected as shown. DNVDIC 50 includes a first P-channel transistor Q1, first resistor R1, second transistor Q2, and second resistor R2. The first current path extends from drive node 54, through transistor Q1, through resistor R1, and to ground terminal 47. The second current path extends from drive node 54, through resistor R2, through transistor Q2, and to ground terminal 47. Initially, when the input signal SIN on input signal node 52 has a digital logic low level, a digital logic high level is present on drive node 54 and on the gate 53 of switch Q0. Because the voltage on input signal node 52 is low, P-channel transistor Q3 is on and conductive and N-channel transistor Q2 is off and nonconductive. Inverter 56 supplies an inverted version of the input signal onto the gate of P-channel transistor Q1. Because SIN is a digital logic low level, a digital logic high level is present on the gate of Q1 and Q1 is off and nonconductive. Because both transistors Q1 and Q2 are off and nonconductive, DNVDIC 50 provides a "high impedance" between drive node 54 and ground terminal 47. Because P-channel transistor Q3 is on and conductive the drive node 54 is pulled up to the supply voltage VIN of four volts on terminal 48.

Next, the input signal SIN transitions from the digital logic low level to a digital logic high level. This causes transistors Q1 and Q2 to be turned on and to be conductive, and causes P-channel transistor Q3 to be turned off. Because both transistors Q1 and Q2 are conductive, current flows through both the first current path and the second current path from drive node 54 to ground terminal 47. Assuming that the drain-to-source on resistance of transistors Q1 and Q2 is much smaller than the resistance of either resistor R1 or R2, the effective pulldown impedance of DNVDIC 50 is the equivalent resistance of parallel resistors R1 and R2. The equivalent resistance (the "low impedance") is given by (R1*R2)/R1+R2. As a result of this low impedance pulldown on node 54, the drive node voltage VDN decreases rapidly.

When the voltage VDN on node 54 reaches and goes below the threshold voltage of P-channel transistor Q1, there is less than a threshold voltage across the gate to source of transistor Q1. The gate of transistor Q1 is at ground potential due to inverter 56. Transistor Q1 therefore is turned off and develops a high drain-to-source impedance. Current flow through the first current path stops. The effective pulldown impedance of DNVDIC 50 between node 54 and ground terminal 47 is then resistance R2. This is a higher impedance than the "low impedance", and is referred to here as the "midrange impedance". Due to this higher impedance between node 54 and ground terminal 47, the rate of decrease of the voltage VDN changes to smaller rate. Current continues to flow through resistor R2 and the second current path until the gate capacitance of switch Q0 is fully discharged and the voltage VDN reaches ground potential. It is therefore seen that the circuit of FIG. 12 is like the circuits of FIGS. 8 and 11 in that DNVDIC 50 initially couples node 54 to ground terminal 47 with the "low impedance", but when the voltage VDN reaches a threshold voltage of a device in the first current path the DNVDIC 50 changes to have the higher "midrange impedance". The circuit of FIG. 12 is different than the circuits of FIGS. 8 and 11 in that the device whose threshold voltage it is is a P-channel transistor (transistor Q1). In the circuits of FIGS. 8 and 11, on the other hand, the device is a diode-connected N-channel transistor. Moreover, the circuit of FIG. 12 is different than the circuits of FIGS. 8 and 11 in that the device whose threshold voltage it is is a low voltage transistor, whereas the switch Q0 is a high voltage and larger transistor. The fact that the device is a different type of transistor than switch Q0 makes threshold voltage tracking of DNVDIC 50 to the threshold of switch Q0 somewhat difficult. In its ability to track the changes in the threshold voltage of switch Q0, the DNVDIC of the circuits of FIGS. 8 and 11 are believed to be superior to the DNVDIC of the circuit of FIG. 12. However, despite these difficulties relative to the preferred embodiment, this embodiment offers advantages over the prior art in some applications.

Figure 13:
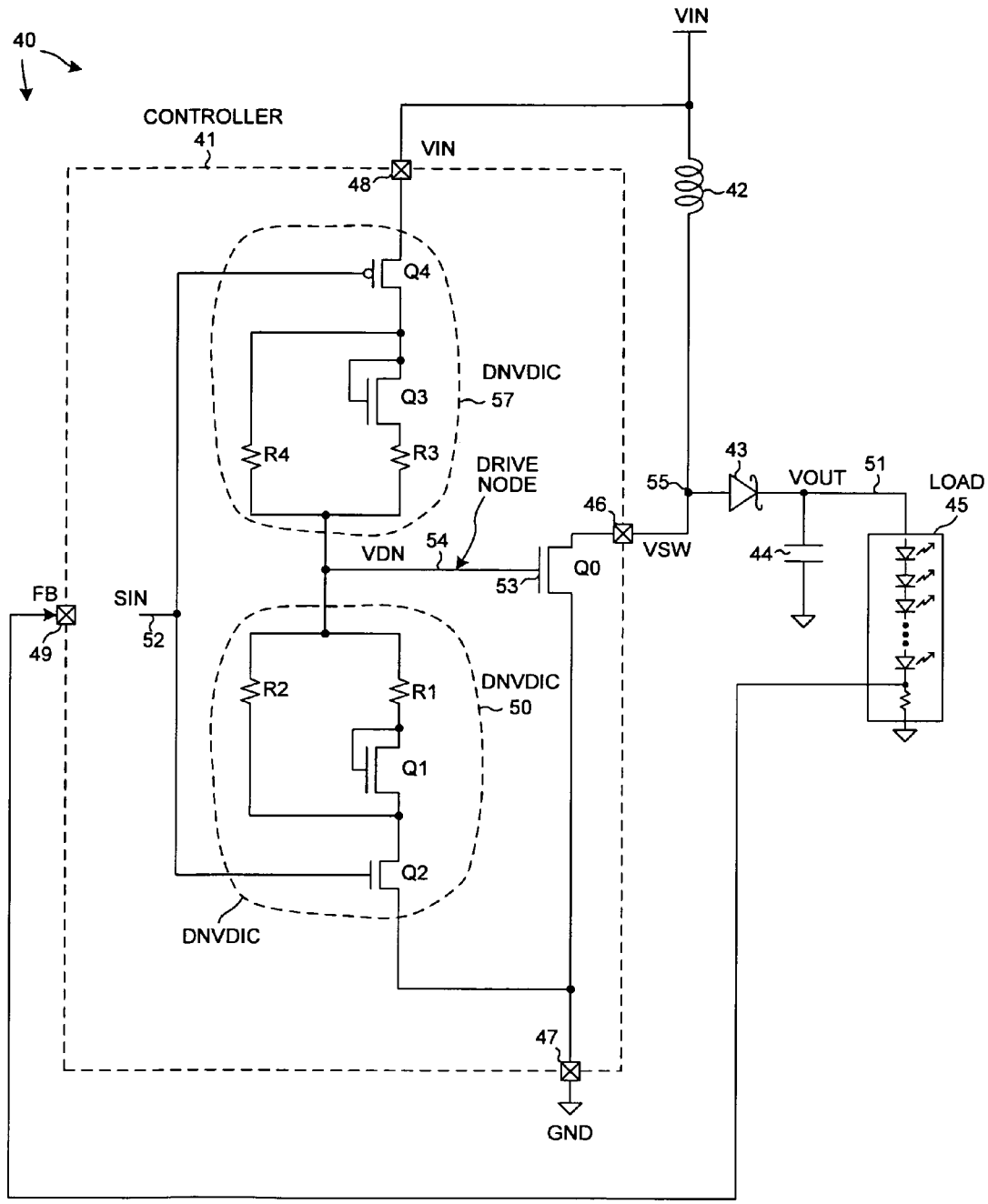
FIG. 13 is a diagram of a fourth embodiment of a novel switching power supply controller integrated circuit.

FIG. 13 is a diagram of a fourth embodiment. In the fourth embodiment, switching power supply controller integrated circuit 41 includes two DNVDIC circuits 50 and 57. Pullup DNVDIC 57 is symmetrical and complementary to pulldown DNVIC 50. Whereas pulldown DNVDIC 50 pulls down on drive node 54 in a high-to-low VDN transition with an initial low impedance followed by a higher midrange impedance as described above, pullup DNVDIC 57 pulls up on drive node 54 in a low-to-high VDN transition with an initial low impedance followed by a higher midrange impedance. When the input signal SIN has a high digital logic level before the transition, P-channel transistor Q4 is off and nonconductive. DNVDIC 57 is therefore said to couple drive node 54 to supply voltage terminal with a high impedance. Then, when input signal SIN transitions from the high digital logic level to a low digital logic level, P-channel transistor Q4 turns on. Current flows through both a first current path and a second current path. The first current path is from supply terminal 48, through transistor Q4, through diode-connected transistor Q3, through resistor R3, and to drive node 54. The second current path is from supply terminal 48, through transistor Q4, through resistor R4, and to drive node 54. Assuming that the drain to source on resistances of transistors Q4 and Q3 are much smaller than the resistances R3 and R4, the DNVDIC impedance between supply voltage terminal 48 and drive node 54 is the equivalent resistance of resistors R3 and R4 in parallel. This value is (R3*R4)/R3+R4 and is referred to here as the low impedance. The voltage VDN on node 54 continues to rise due to charging of the gate capacitance of switch Q0 through the first and second current paths. The rate of charging is relatively rapid. Then, when the voltage VDN reaches one threshold voltage of the supply voltage VIN on terminal 48, there is no longer a threshold voltage drop across diode-connected transistor Q3. Diode-connected transistor Q3 turns off and becomes a high impedance, and stops current flow through the first current path. The impedance of DNVDIC 57 is therefore the resistance of resistor R4 in the second current path. This larger resistance is referred to here as the "midrange impedance". Gate 53 continues to charge through this midrange impedance until the gate voltage reaches VIN on terminal 48.

The charging of the gate through the higher midrange impedance during the terminal portion of the low-to-high transition reduces the rate of increase of the voltage VDN and helps to avoid high dV/dT and ringing on switch node 55 when the voltage VSW transitions downward to ground when switch S0 is turned on. Note the ringing 62 in the VSW waveform of FIG. 9 at the end of the high-to-low VSW transition on switch node 55. This ringing 62 is reduced or eliminated by DNVDIC 57. Rather than the rising edge of the waveform VDN having a single large slope as illustrated in FIG. 9, if DNVDIC 57 is used then the low-to-high VDN transition will have an initial steep portion followed by a terminal portion that is less steep. The drive node voltage at which the impedance of DNVDIC 57 changes from its low pullup impedance to its midrange pullup impedance can be set to a desired voltage by changing the device Q3. Multiple diode-connected transistors connected in series may, for example, be employed.

Figure 14:
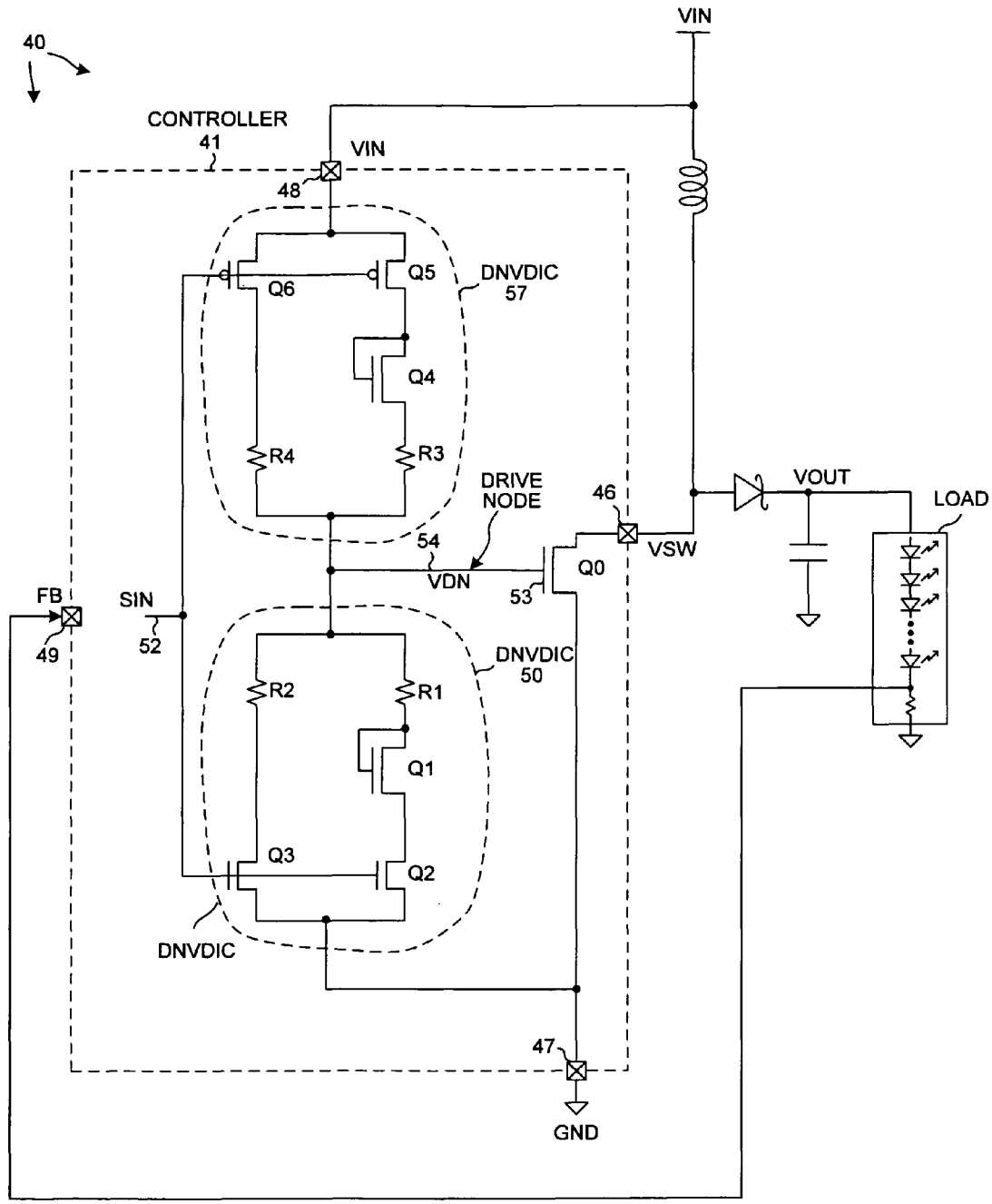
FIG. 14 is a diagram of a fifth embodiment of a novel switching power supply controller integrated circuit.

FIG. 14 is a diagram of a fifth embodiment. In the fifth embodiment, DNVDIC 50 and DNVDIC 57 are both of the topology of DNVDIC 50 as set forth and described above in connection with FIG. 11. DNVDIC 57 is a pullup impedance version of pulldown impedance DNVDIC 50.

Figure 15:
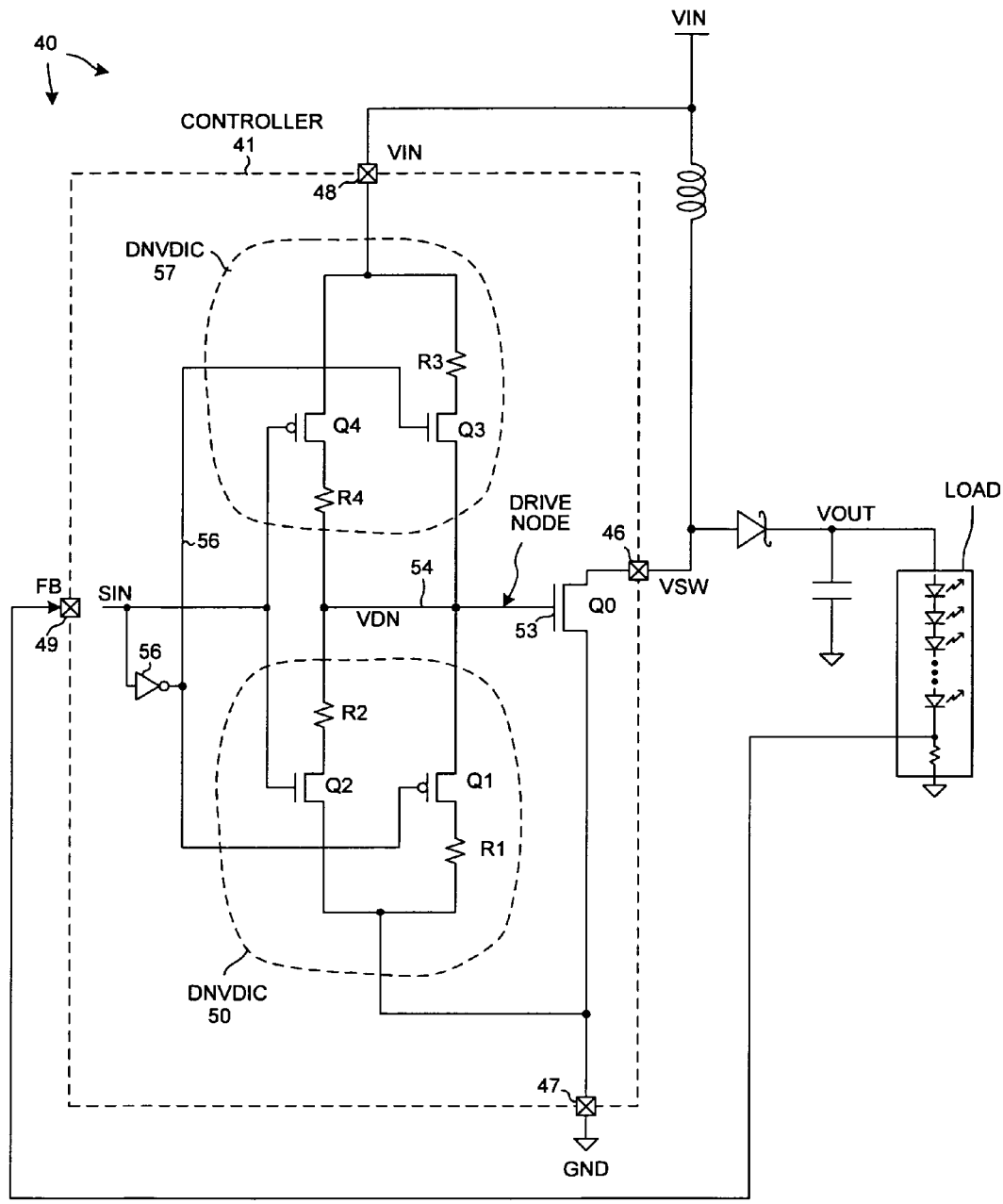
FIG. 15 is a diagram of a sixth embodiment of a novel switching power supply controller integrated circuit.

FIG. 15 is a diagram of a sixth embodiment. In the sixth embodiment, DNVDIC 50 and DNVDIC 57 are both of the topology of DNVDIC 50 as set forth and described above in connection with FIG. 12. DNVDIC 57 is a pullup impedance version of pulldown impedance DNVDIC 50.

Figure 16:
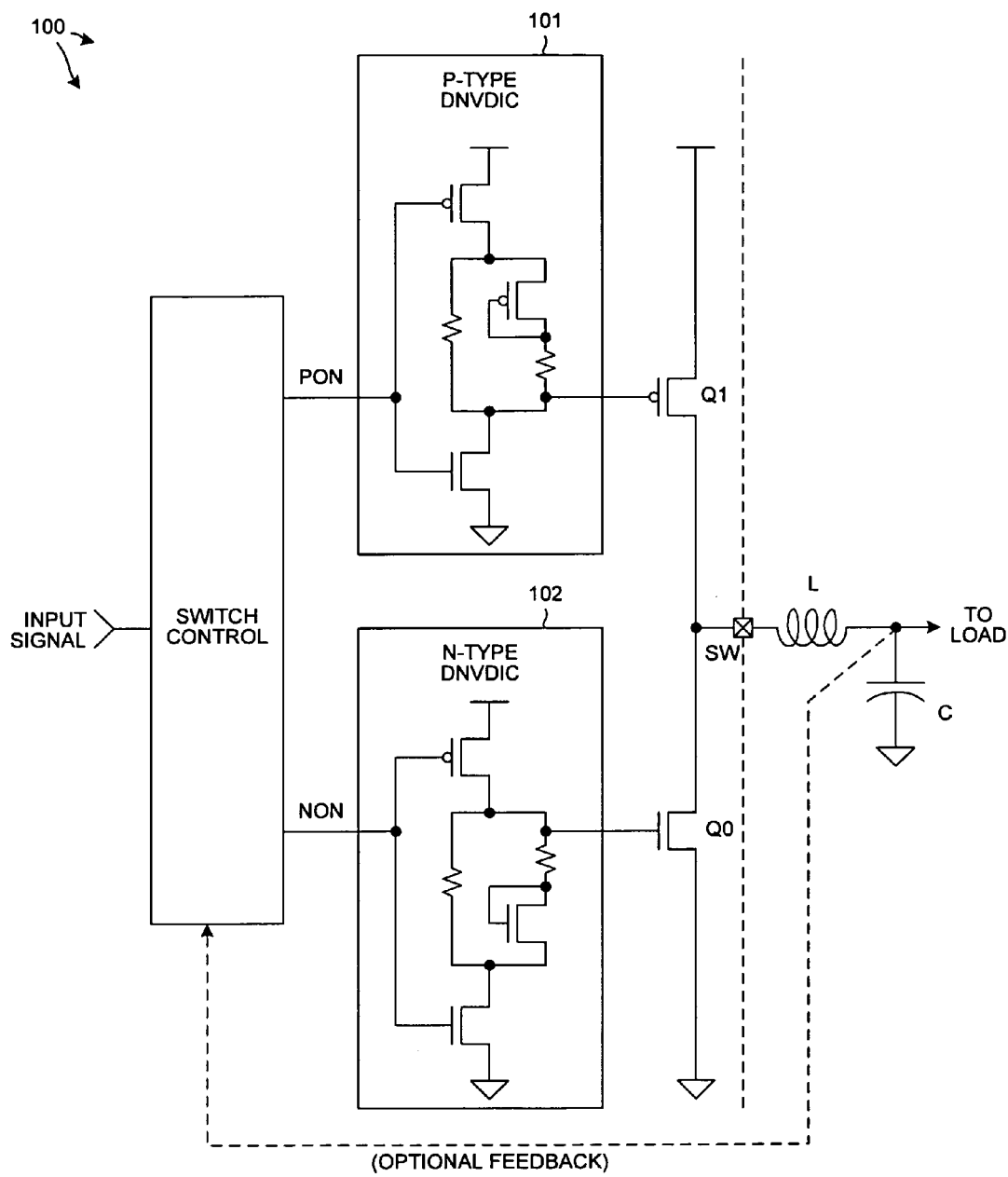
FIG. 16 is a diagram of a Class-D switching amplifier that includes two of novel DNVDICs.

FIG. 16 is a diagram of a Class-D switching amplifier 100 that includes two of the novel DNVDICs 101 and 102.

Although the invention is described above in connection with certain exemplary embodiments, the invention is not limited to the exemplary embodiments. Although resistors are illustrated disposed in series with transistors in the first and second current paths in embodiments above, in some embodiments there are no such resistors. Rather, the transistor is made to have a drain-to-source on resistance equal to the resistance of the resistor, and no resistor is provided in the actual circuit. When the transistor is on and conductive, the on resistance of the transistor provides the resistance of the current path. By properly sizing the transistors (for example, transistors Q2 and Q3 in the embodiment of FIG. 11) to have appropriate drain-to-source on resistances, both the "low impedance" and the "midrange impedance" are set to desired impedance values and series resistors (for example, resistors R1 and R2) are not provided. Although the novel DNVDIC circuits described above utilize two parallel current paths, a DNVDIC may employ more than two parallel current paths such that the DNVDIC exhibits an output impedance that has more than just the above-described three drive node voltage dependent impedance values (the high output impedance, the midrange output impedance, and the low output impedance).

Although the DNVDIC is explained above in connection with driving a switch in a switching power supply, the DNVDIC sees applications driving other circuits. The DNVDIC is usable, for example, to drive signals onto signal lines in such a way that ringing on the signal lines is avoided. The device that the novel DNVDIC drives need not be an ordinary field effect transistor but rather may be another type of devices such as a DMOS transistor, an IGBT, or an ordinary bipolar transistor. The term "threshold voltage" as the term is used in this patent document applies loosely to describe the voltage necessary to turn on not just a diode-connected field effect transistor (see transistor Q1 of FIG. 8) or an ordinary field effect transistor (see transistor Q1 of FIG. 12), but also other semiconductor devices such as an ordinary PN junction or a diode-connected bipolar junction transistor. The body effect may be used to adjust the predetermined voltage at which the DNVDIC transitions from its low output impedance to its midrange output impedance. Rather than using a diode-connected transistor, a transistor is employed and the body is connected to a voltage. The magnitude of the voltage is used to set and/or adjust the threshold voltage of the transistor such that the predetermined voltage is a desired value. Accordingly, various modifications, adaptations, and combinations of various features of the described embodiments can be practiced without departing from the scope of the invention as set forth in the claims.

What is claimed is:

1. A switching power supply controller comprising:
   a drive node;
   an input signal node;
   a first supply node;
   a first current path that extends from the drive node, through a diode, to a drain of a transistor, through the transistor, and to the first supply node, wherein a gate of the transistor is coupled to receive an input signal from the input signal node; and
   a second current path that extends from the drive node, through a substantial resistance, to the drain of the transistor, through the transistor, and to the first supply node, wherein:
   1) if a voltage on the drive node is above a threshold voltage of the diode and if the input signal has a second digital logic level then a first current flows through the first current path and a second current flows through the second current path such that the first and second current paths form a relatively low impedance coupling between the drive node and the first supply node; whereas
   2) if the voltage on the drive node is below the threshold voltage of the diode and if the input signal has the second digital logic level then substantially no current flows through the first current path such that the first and second current paths form a midrange impedance coupling between the drive node and the first supply node; and whereas
   3) if the input signal has a first digital logic level then the transistor is nonconductive and substantially no current flows in either the first current path or the second current path such that the first and second current paths form a relatively high impedance coupling between the drive node and the first supply node.

2. A switching power supply controller comprising:
   a drive node;
   an input signal node;
   a first supply node;
   a first current path that extends from the drive node, through a diode, to a drain of a first transistor, through the first transistor, and to the first supply node, wherein a gate of the first transistor is coupled to receive an input signal from the input signal node;
   a second current path that extends from the drive node, through a substantial resistance, to the drain of the first transistor, through the first transistor, and to the first supply node; and
   a field effect transistor (FET) having a gate, a drain, and a source, wherein the gate is coupled to the drive node, and wherein the FET switches current flow through an inductor of a switching power supply.

3. The switching power supply controller of claim 2, wherein the diode is a diode-connected high voltage transistor, wherein the FET is a high voltage transistor, and wherein the first transistor is a low voltage transistor.

4. A switching power supply controller comprising:
   a drive node;
   an input signal node;
   a first supply node;
   a first current path that extends from the drive node, through a diode, to a drain of a first transistor, through the first transistor, and to the first supply node, wherein a gate of the first transistor is coupled to receive an input signal from the input signal node; and
   a second current path that extends from the drive node, through a substantial resistance, to a drain of a second transistor, through the second transistor, and to the first supply node, wherein a gate of the second transistor is coupled to the gate of the first transistor, wherein:
   1) if a voltage on the drive node is above a threshold voltage of the diode and if the input signal has a second digital logic level then a first current flows through the first current path and a second current flows through the second current path such that the first and second current paths form a relatively low impedance coupling between the drive node and the first supply node; whereas
   2) if the voltage on the drive node is below the threshold voltage of the diode and if the input signal has the second digital logic level then substantially no current flows through the first current path such that the first and second current paths form a midrange impedance coupling between the drive node and the first supply node; and whereas
   3) if the input signal has a first digital logic level then the first and second transistors are nonconductive and substantially no current flows in either the first current path or the second current path such that the first and second current paths form a relatively high impedance coupling between the drive node and the first supply node.

5. A switching power supply controller comprising:
   a drive node;
   an input signal node, wherein an input signal is present on the input node;
   a first supply node;
   a first current path that extends from the drive node, to a source of a first transistor of a first conductivity type, through the first transistor to a drain of the first transistor, and to the first supply node, wherein a gate of the first transistor is coupled to receive an inverted version of the input signal; and
   a second current path that extends from the drive node, to a drain of a second transistor of a second conductivity type, through the second transistor to a source of the second transistor, and to the first supply node, wherein a gate of the second transistor is coupled to receive the input signal, wherein:
   1) if a voltage on the drive node is above a threshold voltage of the first transistor and if the input signal has a second digital logic level then a first current flows through the first current path and a second current flows through the second current path such that the first and second current paths form a relatively low impedance coupling between the drive node and the first supply node; whereas
   2) if the voltage on the drive node is below the threshold voltage of the first transistor and if the input signal has the second digital logic level then substantially no current flows through the first current path such that the first and second current paths form a midrange impedance coupling between the drive node and the first supply node; and whereas 3) if the input signal has a first digital logic level then the first and second transistors are both nonconductive and substantially no current flows in either the first current path or the second current path such that the first and second current paths form a relatively high impedance coupling between the drive node and the first supply node.

6. A switching power supply controller comprising:
a drive node;
an input signal node, wherein an input signal is present on the input node;
a first supply node;
a first current path that extends from the drive node, to a source of a first transistor of a first conductivity type, through the first transistor to a drain of the first transistor, and to the first supply node, wherein a gate of the first transistor is coupled to receive an inverted version of the input signal; and
a second current path that extends from the drive node, to a drain of a second transistor of a second conductivity type, through the second transistor to a source of the second transistor, and to the first supply node, wherein a gate of the second transistor is coupled to receive the input signal, wherein the first transistor is a P-channel transistor, wherein the second transistor is an N-channel transistor, wherein the drain of the first transistor is resistively coupled to the first supply node, wherein the drain of the second transistor is resistively coupled to the drive node, and wherein the first supply node is a ground node.

7. A switching power supply controller comprising:
a drive node;
an input signal node, wherein an input signal is present on the input node;
a first supply node;
a first current path that extends from the drive node, to a source of a first transistor of a first conductivity type, through the first transistor to a drain of the first transistor, and to the first supply node, wherein a gate of the first transistor is coupled to receive an inverted version of the input signal; and
a second current path that extends from the drive node, to a drain of a second transistor of a second conductivity type, through the second transistor to a source of the second transistor, and to the first supply node, wherein a gate of the second transistor is coupled to receive the input signal, wherein the first supply node is a supply voltage node, wherein the first transistor is an N-channel transistor, wherein the second transistor is a P-channel transistor, wherein if the first transistor is conductive a first current flows through the first current path from the first supply node to the drive node, wherein if the second transistor is conductive a second current flows through the second current path from the first supply node to the drive node, and wherein a low-to-high voltage transition of the input signal causes a high-to-low voltage transition on the drive node.

8. A switching power supply controller comprising:
a drive node;
an input signal node, wherein an input signal is present on the input node;
a first supply node;
a first current path that extends from the drive node, to a source of a first transistor of a first conductivity type, through the first transistor to a drain of the first transistor, and to the first supply node, wherein a gate of the first transistor is coupled to receive an inverted version of the input signal;
a second current path that extends from the drive node, to a drain of a second transistor of a second conductivity type, through the second transistor to a source of the second transistor, and to the first supply node, wherein a gate of the second transistor is coupled to receive the input signal; and
a field effect transistor (FET) having a gate, a drain, and a source, wherein the gate is coupled to the drive node, and wherein the FET switches current flow through an inductor of a switching power supply.

9. A method, comprising:
providing a first current path from a gate of field effect transistor (FET) to a first supply node such that a first current flows through the first current path during a transition time period when a voltage on the gate is transitioning to switch the FET, wherein a semiconductor device having a threshold voltage is disposed in the first current path, wherein the first current flows when a voltage drop across the semiconductor device is at least as great as the threshold voltage but wherein the first current stops flowing when the voltage drop is less than the threshold voltage; and
providing a second current path from the gate to the first supply node such that a second current flows through the second current path during the transition time period, wherein the second current flows both when the first current is flowing and after the first current has stopped flowing due to the voltage drop across the semiconductor device being less than the threshold voltage.

10. The method of claim 9, wherein the semiconductor device is a diode-connected N-channel transistor, and wherein the FET is an N-channel transistor.

11. The method of claim 9, wherein the semiconductor device is a P-channel transistor, and wherein the FET is an N-channel transistor.

12. The method of claim 9, wherein the semiconductor device is a diode-connected P-channel transistor, and wherein the FET is a P-channel transistor.

13. The method of claim 9, wherein the semiconductor device is an N-channel transistor, and wherein the FET is a P-channel transistor.

14. The method of claim 11, further comprising:
preventing current flow through the first and second current paths when a digital input signal has a first digital value, wherein a switching of the digital input signal from a first digital value to the second digital value causes a voltage on the gate of the FET to transition.

15. The method of claim 11, wherein the first supply node is a ground node, and wherein the first and second currents flow during the transition time period to reduce a voltage on the gate of the FET.

16. The method of claim 11, wherein the first supply node is a supply voltage node, and wherein the first and second currents flow during the transition time period to increase a voltage on the gate of the FET.

17. The method of claim 11, further comprising:
using the FET to switch current flow through an inductor in a switching power supply.

18. The method of claim 11, wherein the semiconductor device is a transistor, wherein a source of the transistor is coupled to the drive node, wherein a drain of the transistor is coupled to the first supply node, and wherein the first current flows through the transistor.

19. The method of claim 11, wherein a source of a transistor is coupled to the first supply node, wherein a drain of the transistor is coupled to the drive node, and wherein the second current flows through the transistor.

20. The method of claim 11, wherein the FET is a FET within a Class-D switching amplifier.

21. A circuit comprising:
a field effect transistor (FET) having a gate;
a ground node; and
means for causing a high-to-low voltage transition on the gate by initially coupling the gate to the ground node through a relatively low pulldown impedance when a voltage on the gate is above a predetermined voltage, wherein the means is also for increasing the pulldown impedance when the voltage on the gate drops below the predetermined voltage, wherein said increasing of the pulldown impedance is performed without use of a comparator and without use of a one-shot, wherein the means includes a current path between the gate and the ground node, wherein a diode is disposed in the current path, and wherein the diode is no longer forward biased and stops current flow in the current path when the voltage on the gate drops below the predetermined voltage.

22. A circuit comprising:
a field effect transistor (FET) having a gate;
a ground node; and
means for causing a high-to-low voltage transition on the gate by initially coupling the gate to the ground node through a relatively low pulldown impedance when a voltage on the gate is above a predetermined voltage, wherein the means is also for increasing the pulldown impedance when the voltage on the gate drops below the predetermined voltage, wherein said increasing of the pulldown impedance is performed without use of a comparator and without use of a one-shot, wherein the means includes a current path between the gate and the ground node, wherein a P-channel transistor is disposed in the current path, and wherein a gate-to-source voltage across the P-channel transistor drops below a threshold voltage of the P-channel transistor such that the P-channel transistor becomes non-conductive and stops current flow in the current path when the voltage on the gate drops below the predetermined voltage.

23. The circuit of claim 21, wherein the means does not include a number of transistors greater than three.

24. A circuit comprising:
a field effect transistor (FET) having a gate;
a ground node; and
means for causing a high-to-low voltage transition on the gate by initially coupling the gate to the ground node through a relatively low pulldown impedance when a voltage on the gate is above a predetermined voltage, wherein the means is also for increasing the pulldown impedance when the voltage on the gate drops below the predetermined voltage, wherein said increasing of the pulldown impedance is performed without use of a comparator and without use of a one-shot, wherein the means includes a first resistive element having a first resistance R1 and a second resistive element having a second resistance R2, wherein the relatively low pulldown impedance is approximately equal to (R1*R2)/R1+R2, wherein the means has a midrange impedance when the voltage on the gate drops below the predetermined voltage, and wherein the midrange impedance is approximately equal to R2.

25. The circuit of claim 21, wherein the circuit is a switching power supply controller integrated circuit.

26. The circuit of claim 21, wherein the circuit is a Class-D switching amplifier.

* * * * *